(12) United States Patent
Matsuda et al.

(10) Patent No.: US 6,189,485 B1
(45) Date of Patent: Feb. 20, 2001

(54) PLASMA CVD APPARATUS SUITABLE FOR MANUFACTURING SOLAR CELL AND THE LIKE

(75) Inventors: Akihisa Matsuda, Tsuchiura; Yoshimi Watabe, Kunitachi; Hideo Yamagishi, Kyotanabe; Masataka Kondo, Kobe; Takashi Hayakawa, Soraku-gun, all of (JP)

(73) Assignees: Anelva Corporation; Takeo Sato, Japan as represented by the Director General of Agency of Industrial Science and Technology, both of Tokyo; Sharp Kabushiki Kaisha; Kaneka Corporation, both of Osaka (JP)

( * ) Notice: Under 35 U.S.C. 154(b), the term of this patent shall be extended for 0 days.

(21) Appl. No.: 09/337,661

(22) Filed: Jun. 22, 1999

(30) Foreign Application Priority Data

Jun. 25, 1998 (JP) .................................................. 10-194966

(51) Int. Cl.$^7$ ..................................................... C23C 16/00
(52) U.S. Cl. ..................... 118/723 E; 118/715; 156/345
(58) Field of Search .......................... 118/723 E, 723 ER, 118/723 I, 723 IR, 723 R, 715; 156/345

(56) References Cited

U.S. PATENT DOCUMENTS

| 5,356,476 | * | 10/1994 | Foster et al. | 118/725 |
| 5,532,190 | * | 7/1996 | Goodyear et al. | 437/225 |

FOREIGN PATENT DOCUMENTS

| 64-47875 | 2/1989 | (JP) . |
| 1-181513 | 7/1989 | (JP) . |
| 4-21781 | 1/1992 | (JP) . |
| 4-120277 | 4/1992 | (JP) . |
| 4-236781 | 8/1992 | (JP) . |
| 5-139883 | 6/1993 | (JP) . |
| 5-283344 | 10/1993 | (JP) . |
| 5-343338 | 12/1993 | (JP) . |
| 7-330488 | 12/1995 | (JP) . |
| 8-253864 | 10/1996 | (JP) . |
| 8-325092 | 12/1996 | (JP) . |
| 8-330235 | 12/1996 | (JP) . |
| 9-71867 | 3/1997 | (JP) . |
| 9-162131 | 6/1997 | (JP) . |
| 10-50614 | 2/1998 | (JP) . |

* cited by examiner

Primary Examiner—Thi Dang
Assistant Examiner—Luz Alejandro
(74) Attorney, Agent, or Firm—Oliff & Berridge, PLC

(57) ABSTRACT

A substrate is disposed in a reactor kept to be a vacuum state, a material gas is supplied into a space in front of the substrate, high-frequency electric power is supplied to the material gas to generate plasma based on electric discharge excitation in the front space of the substrate, and an amorphous silicon thin film is deposited on the substrate by chemical vapour deposition. Further, an electrode section comprising tubular electrodes supplying the material gas through a plurality of gas discharge openings, and tubular electrode sucking and evacuating gases to the outside through a plurality of gas suction openings. Thereby, a higher silane gas and the like generated during the film deposition can be removed from a reactive region immediately, and a thin film is deposited on the substrate surface with the same condition of the film deposition at any spot of the substrate surface. Consequently, the amorphous silicon thin film with film quality may be deposited on the large-area substrate.

11 Claims, 10 Drawing Sheets

PLASMA CVD APPARATUS SUITABLE FOR MANUFACTURING SOLAR CELL AND THE LIKE

BACKGROUND OF THE INVENTION

1. Field of the Invention

The present invention relates to a plasma CVD apparatus and method suitable for depositing an amorphous silicon thin film utilizable for solar cells or thin film transistors and the like.

2. Description of the Related Art

An apparatus disclosed in JP-A-5-343338, for example, has been known as a conventional plasma CVD apparatus used for manufacturing large-sized solar cells by depositing an amorphous silicon thin film onto a large-sized substrate. The plasma CVD apparatus has a cathode electrode unit, and an anode electrode on which a substrate is loaded. The cathode electrode unit has a plurality of cathode electrodes which are arranged so that all of their lower surfaces are positioned on a common plane. The cathode electrode unit has a plasma non-generation region at the backs of the plurality of cathode electrodes. Gas ejection openings of a plurality of gas supply tubes for supplying a material gas toward a substrate are arranged in the plasma non-generation region. Further, the cathode electrode unit has a plurality of gas evacuation openings, each of which is positioned between the two adjacent gas ejection openings. The gas ejection openings and the gas evacuation openings are arranged by turns. Since the plurality of gas ejection openings are placed in the plasma non-generation region, generation of contamination powder can be prevented. This arrangement such that the plurality of gas ejection openings and the gas evacuation openings ire placed to be mutually separated causes the material gas to diffuse uniformly.

As other related conventional plasma CVD apparatus, there are apparatus disclosed in the laid-open publications of JP-A-4-236781 and JP-A-7-330488, for example. The plasma CVD apparatus of JP-A-4-236781 has an electric discharge electrode formed by a plane coil having a ladder shape, which is placed to be parallel with a substrate. The ladder-shaped plane coil is formed out of a wire rod. A material gas is introduced into a reactor through a gas introduction tube arranged in one spot of the reactor while the reactor is evacuated through a gas evacuation tube arranged in another spot of the reactor. The plane coil can enhance strength of an electric field and improve uniformity thereof. The plasma CVD apparatus of JP-A-7-330488 has a structure such that a hollow ladder electrode with an earth shield is arranged to be parallel to a substrate. This structure can make the region of strong electromagnetic field strength in the vicinity of the electrode, into which a reactive gas is introduced, and thereby enhance a quality of the amorphous silicon thin film deposited on the substrate. Also, an evacuation tube for evacuating the inside of the reactor is placed in the surrounding area of the substrate in the reactor.

When depositing the amorphous silicon thin film onto a rectangular substrate having large area (for example, 550 mm×650 mm) in order to make a large-area solar cell by making use of the conventional ordinary plasma CVD apparatus, following problems should be posed.

When attempting to form the thin film at a high rate by using the conventional plasma CVD apparatus, great electric power must be supplied. The supply of the great electric power causes the film quality to be deteriorated. This deterioration of the film quality is due to a higher silane gas generated within high density plasma. Therefore, it is necessary to immediately remove this higher silane gas from a reactive region during the thin film deposition.

On the contrary, in the conventional plasma CVD apparatus, a gas supply section through which the material gas is introduced into the internal space of the reactor is generally the shower-head-type gas supply mechanism and functions as one of two electrodes forming a parallel-plate-type electrode structure. The gas supply section is disposed in front of the processed surface of the substrate and supplies the material gas toward the processed surface of the substrate. Also, an evacuation mechanism for causing the inside of the reactor to be vacuum state or evacuating unnecessary gases within the reactor to the outside is arranged at the peripheral section of the reactor around the substrate. Therefore, in the conventional plasma CVD apparatus, the material gas streams from the center region to the peripheral region on the substrate surface to be processed, and thus the gas upper stream region is formed at the center of the processed surface of the substrate while the gas lower stream region is formed at the periphery of the processed surface. This matter in accordance with the conventional plasma CVD apparatus resulted in the difficulty of immediately removing the higher silane gas from the reactive region and posed the problem such that the film quality at the center of the surface is easy to be deteriorated. The area of the substrate becomes wide the more, the more remarkable is this problem. The thin film utilized for the solar cell is especially required to have a high quality in the aspect of the film structure. The conventional plasma CVD apparatus has difficulty of no satisfying the requirements because it has the above-mentioned problems.

Also, in the respective plasma CVD apparatus mentioned above in accordance with the laid-open publications of Japanese application, concerning the flowing of the gas introduced toward the substrate, the upper stream region and the lower stream region are formed on the basis of the positional relationship of gas discharge openings and gas evacuation openings and therefore the similar problem as mentioned above is raised.

SUMMARY OF THE INVENTION

An object of the present invention is to provide a plasma CVD apparatus capable of depositing a high-quality amorphous silicon thin film onto a surface of a large-area substrate because of immediately removing the higher silane gas and the like generated during the film forming from the reactive region, and further because of depositing the thin film onto the substrate surface under the condition such that any place on the substrate surface has the same state.

Another object of the present invention is to provide a plasma CVD method capable of making a solar cell formed by using a high-quality thin film as mentioned above.

The plasma CVD apparatus of the present invention is configured as follows in order to attain the above-mentioned objects.

This plasma CVD apparatus is configured so that a substrate is disposed in a reactor kept to be a predetermined vacuum state by an evacuation pump mechanism, a material gas is supplied into a space in front of the substrate, high-frequency electric power is supplied to the material gas to generate plasma based on electric discharge excitation in the front space of the substrate, and a thin film may be deposited on a surface of the substrate by chemical vapour deposition (CVD) enhanced by the plasma. For example, the substrate is a large-sized glass substrate and the thin film is an amorphous silicon thin film used for a solar cell. The plasma CVD apparatus further is comprised of a gas supply body having a plurality of gas discharge openings through each of which the material gas is supplied into the front space, and a gas evacuation body having a plurality of gas suction openings through each of which the gas around the gas suction openings is evacuated to the outside. In this structure, the plural gas discharge openings and gas suction openings are arranged so that the individual gas discharge opening and gas suction opening are approached mutually, and the gas supply body and the gas evacuation body are applied with the high-frequency electric power and both are used as an electrode.

In accordance with the above-mentioned structure, the material gas introduced into the reactor through each of the plural gas discharge openings of the gas supply body is excited by the high-frequency electric power to generate the plasma. Reactive action is generated on the material gas, and higher silane and the like produced during the reactive action is sucked through the gas suction openings of the gas evacuation body and is evacuated to the outside through the gas evacuation body. When forming the thin film, the higher silane and the like can be immediately removed from the reactive region. Therefore, the higher silane dose not remain for a long time in the plasma region formed in front of the substrate surface to be processed, that is, the reactive region. Further, according to the structure of the gas supply body and the gas evacuation body, concerning the flowing of the material gas over the substrate surface the upper stream region and the lower stream region are not formed and the same condition for the film deposition onto the substrate is always formed at any spot on the substrate surface. Even if the area of the substrate is increased, the above-mentioned condition may be kept to be unchanging by merely increasing a scale of the gas supply body and the gas evacuation body.

In the plasma CVD apparatus, preferably, the gas supply body is formed by a plurality of straight tubes disposed within an imaginary plane substantially parallel to the substrate and the gas evacuation body is formed by a plurality of straight tubes disposed within the imaginary plane, and the plural straight tubes for gas supply and the plural straight tubes for gas evacuation are alternately disposed in a parallel mode and the gas discharge opening faces to the gas evacuation opening individually.

In the above-mentioned structure, it is preferable that the plural straight tubes for gas supply and the plural straight tubes for gas evacuation are configured to form a ladder shape.

In the structure, preferably, two substrates are prepared to be parallel, and the imaginary plane within which the plural straight tubes used for gas supply and the plural straight tubes used for gas evacuation are disposed is set to lie in a middle position between the two substrates. Further, it may be configured so that structure comprising of a section formed by the straight tubes for gas supply and the straight tubes for gas evacuation, and the substrates disposed on both sides of the section, is defined as one unit, and layered structure is formed by arranging the unit to make several unit layers, and a heater is arranged on a rear side of each of the substrates. According to this plasma CVD apparatus a lot of substrates can be deposited at the same time and therefore the productivity can be increased more.

In the structure, preferably, each of the plural straight tubes for gas supply and each of the plural straight tubes for gas evacuation has a high-frequency current path length which is a natural number times as long as a half of an excitation wave length of the high-frequency electric power for exciting an electric discharge.

In the structure, the substrate and the imaginary plane are preferably disposed to be vertical.

In the structure, preferably, the gas supply body is formed by a plurality of ring-shaped tubes disposed within an imaginary plane substantially parallel to the substrate to have a concentric positional relationship, and the gas evacuation body is formed by a plurality of ring-shaped tubes disposed within the imaginary plane to have a concentric positional relationship, and the plural ring-shaped tubes for gas supply and the plural ring-shaped tubes for gas evacuation are alternately disposed with maintaining the concentric positional relationship and the gas discharge openings face to said the suction openings individually. This structure enables both-sides film deposition by arranging the substrate on both sides.

In each of the structure, it is preferable that the high-frequency electric power for exciting the electric discharge is supplied intermittently.

The plasma CVD method of the present invention for manufacturing solar cells and the like is the method of depositing a film onto a substrate based on chemical vapour deposition by supplying the material gas into a reactor in which the substrate is disposed, and by generating plasma based on electric discharge excitation with high-frequency electric power. The plasma CVD method comprises a step of supplying the material gas to the plasma generated in a front space of the substrate to form the film, and a step of sucking and evacuating byproduct generated in the plasma at the front space so as to shorten a residual time of the byproduct in the reactor. Thereby, the byproduct is prevented to adhere to the film deposited on the substrate.

In the plasma CVD method, the byproduct is a higher silane gas or powdered material thereof.

Further, the solar cell of the present invention is that made by use of the aforementioned plasma CVD method of the present invention. This solar cell is made by the processes such that a silane gas is used as a material gas, this material gas is introduced into the plasma generated in a front space of a substrate, and further an amorphous silicon thin film is deposited on the surface of the substrate based on the plasma CVD operation. In this case, a residual time (or a stay time) of byproducts generated at the front space in the reactor is shortened as much as possible. Thereby, the adhesion amount of the byproducts on the amorphous silicon thin film presenting the function of the solar cell can be reduced and the quality and ability of the solar cell can be improved.

As mentioned above, in the solar cell with the amorphous silicon thin film made by means of the above-mentioned plasma CVD method, the adhesion amount of the byproducts such as the higher silane gas or the powder thereof onto the thin film can be reduced.

DESCRIPTION OF THE PREFERRED EMBODIMENTS

Hereinafter, the preferred embodiments will be explained in accordance with attached drawings.

Figure 1:
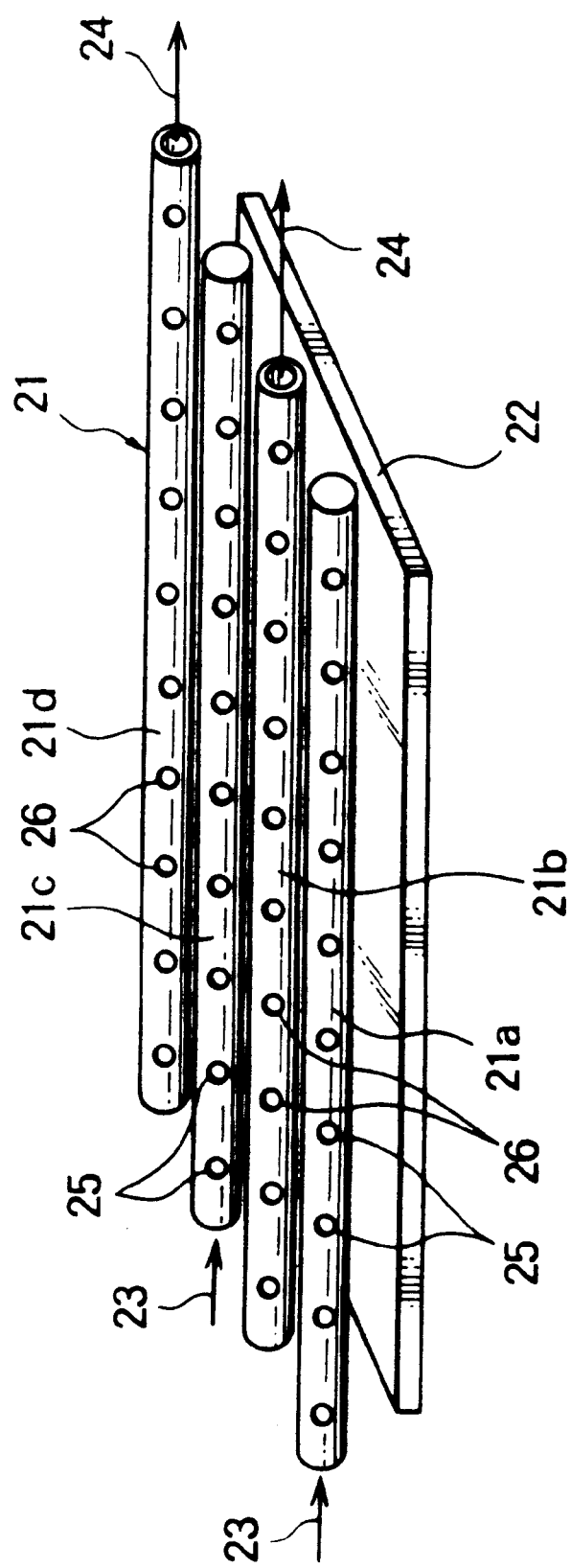
FIG. 1 is a perspective view showing the first embodiment of an electrode section of the plasma CVD apparatus of the present invention and especially one example of an arrangement relationship between a straight tubular electrode and a substrate.
Figure 12:
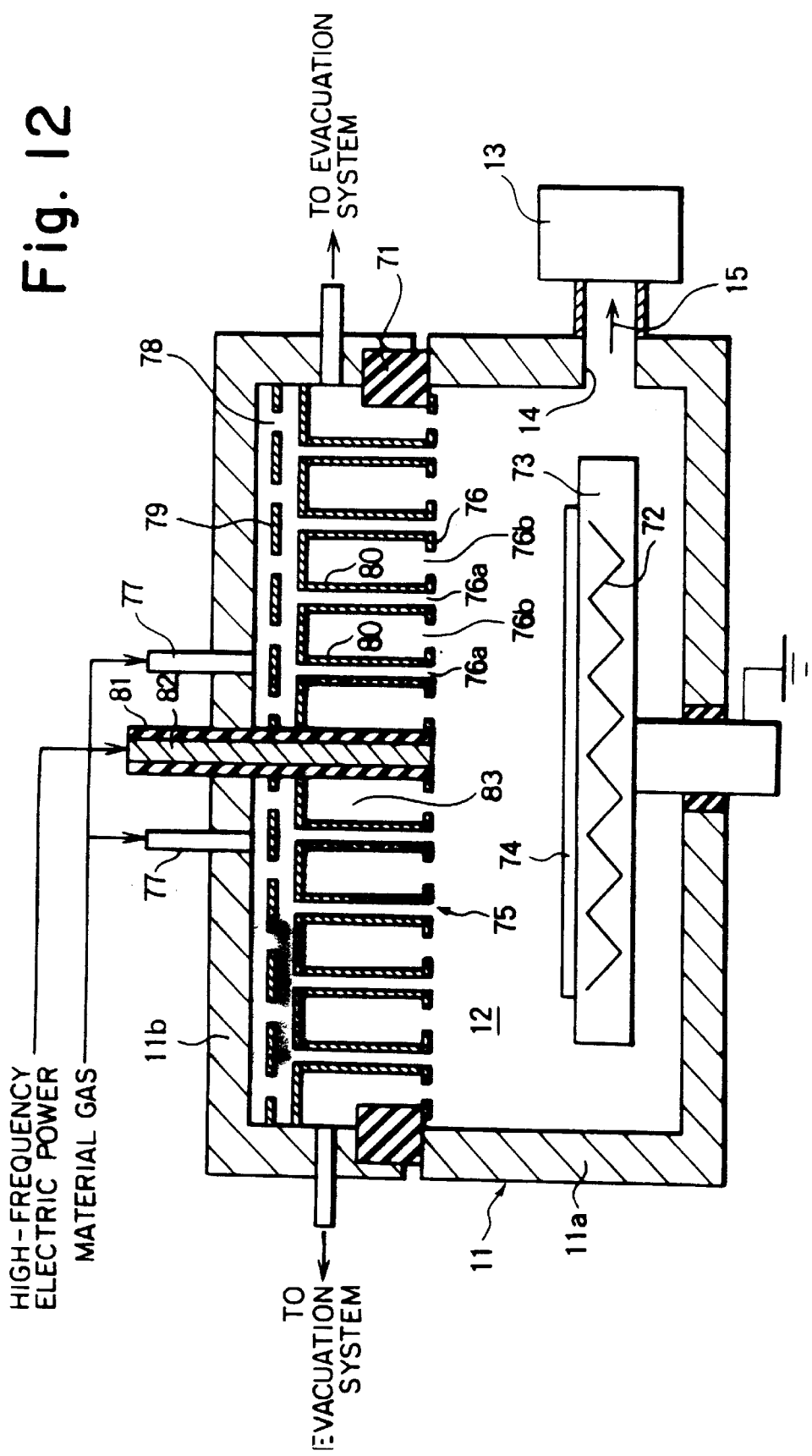
FIG. 12 is a longitudinal sectional view showing the third embodiment of the electrode section in the plasma CVD apparatus of the present invention.

FIG. 1 shows main structure of the first embodiment of the plasma CVD apparatus of the present invention, and further shows one structure example of an electrode section 21 together with a positional relationship between the electrode section 21 and a substrate 22. Whole structure about the plasma CVD apparatus is shown in FIG. 12, for example. As shown in FIG. 12, the plasma CVD apparatus is provided with a reactor 11 having the structure of an airtight container. The internal space 12 of the reactor 11 is evacuated by a vacuum pump 13 arranged at the lower side of the side wall of the reactor 11 through an evacuation opening 14 as shown with an arrow 15 and thereby the space 12 is kept to be a predetermined vacuum state. The electrode section 21 and the substrate 22 shown in FIG. 1 are disposed in the internal space 12 of the reactor 11. In the reactor 11, the electrode section 21 is arranged by means of the well-known support mechanism and the substrate 22 is also held by means of the well-known substrate holder. In FIG. 1, the support mechanism for the electrode section 12 and the substrate holder for the substrate 22 are not shown because of simplifying the drawing.

In accordance with the structure shown in FIG. 1 the electrode section 21 is comprised of four straight and tubular electrodes 21a, 21b, 21c and 21d, for example. The tubular electrode 21a–21d are formed by use of a conductive circular tube or pipe, for example. Although in an actual structure some tubular electrodes more than (or less than) four are used in proportion to the area of the substrate 22, the first embodiment in FIG. 1 shows the four tubular electrodes in order to explain it simply. These tubular electrodes 21a–21d are disposed to be in parallel with each other and to lie on one common imaginary plane parallel to the substrate 22. Among the four tubular electrodes 21a–21d, the tubular electrodes 21a and 21c are used for supplying a material gas into a space (a plasma generation region) in front of the upper surface (the surface on which a thin film can be deposited) of the substrate 12 in the reactor 11 while the tubular electrodes 21b and 21d are used for immediately evacuating a higher silane gas (or powder material made out of large-sized higher silane) and the like generated in the front space to the outside of the reactor 11. The tubular electrode (21a or 21c) for the gas supply and the tubular electrode (21b or 21d) for the gas evacuation are alternately disposed so as to be parallel. In the structure shown in FIG. 1, the left ends of the tubular electrodes 21a and 21c are opened and the right ends thereof are closed, while the left ends of the tubular electrodes 21b and 21d are closed and the right ends thereof are opened. The material gas is supplied into the left ends of the tubular electrodes 21a and 21c as shown by arrows 23. Also, the gas is evacuated from the right ends of the tubular electrodes 21b and 21d as shown by arrows 24.

Figure 4:
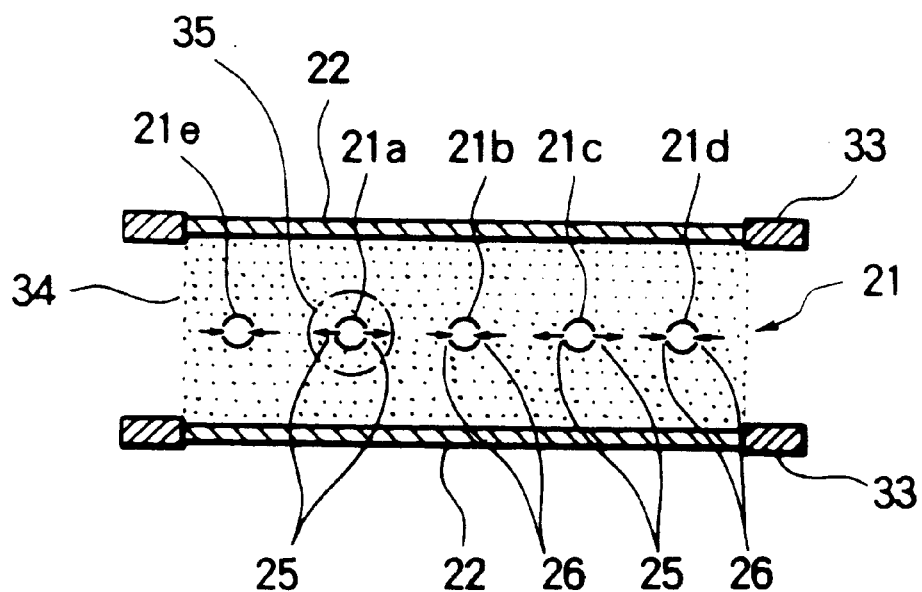
FIG. 4 is a cross section showing one example of action concerning material gas supply and gas evacuation in the structure shown in FIG. 2.

A plurality of gas discharge openings 25 are formed on both sides of each of the tubular electrodes 21a and 21c and they are arranged along the axis direction of each tubular electrode and preferably at regular intervals. The both sides of the tubular electrodes 21a and 21c, on which the gas discharge openings 25 are formed, face the tubular electrodes 21b and 21d respectively. The gas discharge opening 25 is a hole of small diameter. The material gas supplied into the left end of the tubular electrodes 21a and 21c is discharged into the internal space of the reactor 11 through the plural gas discharge openings 25. On the other hand, a plurality of gas suction openings 26 are formed on both sides of each of the tubular electrodes 21b and 21d, and they are arranged along the axis direction of each tubular electrode. The both sides of the tubular electrodes 21b and 21d, on which the gas suction openings 26 are formed, face the tubular electrodes 21a and 21c respectively. Each of the plural gas discharge openings 25 and each of the plural gas suction openings 26 are preferably arranged to be opposite and near with each other. As a practical matter, another tubular electrode used for the gas evacuation, which has the plural gas suction openings respectively opposite to the gas discharge openings 25 of the tubular electrode 21a, is arranged at this side of the tubular electrode 21a. Although FIG. 1 does not show the another tubular electrode positioned at this side, FIG. 4 shows it as a tubular electrode 21e. Gases sucked through the gas suction openings 26 of the tubular electrodes 21b and 21d is blown off from the right ends of them. The discharge direction of the material gas from each gas discharge opening 25 of the tubular electrodes 21a and 21c and the suction direction of the gases around each gas suction opening 26 of the tubular electrodes 21b and 21d are substantially parallel to the surface of the substrate 22 preferably. One example of the gas discharge state at the gas discharge openings 25 and the gas suction state at the gas suction openings 26 is shown in FIG. 4. In FIG. 4, arrows from the gas discharge openings 25 indicate the discharge state of the material gas and arrows toward the gas suction openings 26 indicate the suction state of the gases.

The substrate 22 is a kind of large-area substrate suitable for a solar cell substrate, and is a glass substrate, for example. The upper surface of the substrate 22 is to be deposited and as mentioned below an amorphous silicon thin film is deposited onto the upper surface on the basis of the chemical vapor deposition (CVD) due to the plasma generated by an electric discharge excitation in the front space of the upper surface. The amorphous thin film is used as a film having the function of solar cells. In this embodiment, though the substrate and the amorphous silicon thin film is mainly explained as the components forming the solar cell, a use of the thin film formed by the plasma CVD apparatus of the present invention is not limited to the solar cell naturally.

The action of the electrode section 21 comprised of the tubular electrodes 21a–21d will be explained below in accordance with FIG. 3. The electrode section 21 of the present embodiment works as a primary electrode member, and further fulfills the function such that one part thereof works as gas supplying means for supplying the material gas and another part thereof works as gas evacuating means for evacuating a higher silane gas from the plasma generation region (reactive region) to the outside. One end of each of the tubular electrodes 21a–21d is connected to a high-frequency power source 31 and another end thereof is connected to an earth terminal 32. The high-frequency power source 31 supplies the tubular electrodes 21a–21d with high-frequency electric power. This high-frequency electric power is used for exciting an electric discharge in order to generate the plasma in the front space of the substrate 22. In addition, as mentioned above, at the same time, the one part (21a, 21c) of the tubular electrodes 21a–21d works as a gas supply tubular electrode for supplying the material gas and the remained part (21b, 21d) thereof works as a gas evacuation tubular electrode for evacuating unnecessary gases.

Figure 2:
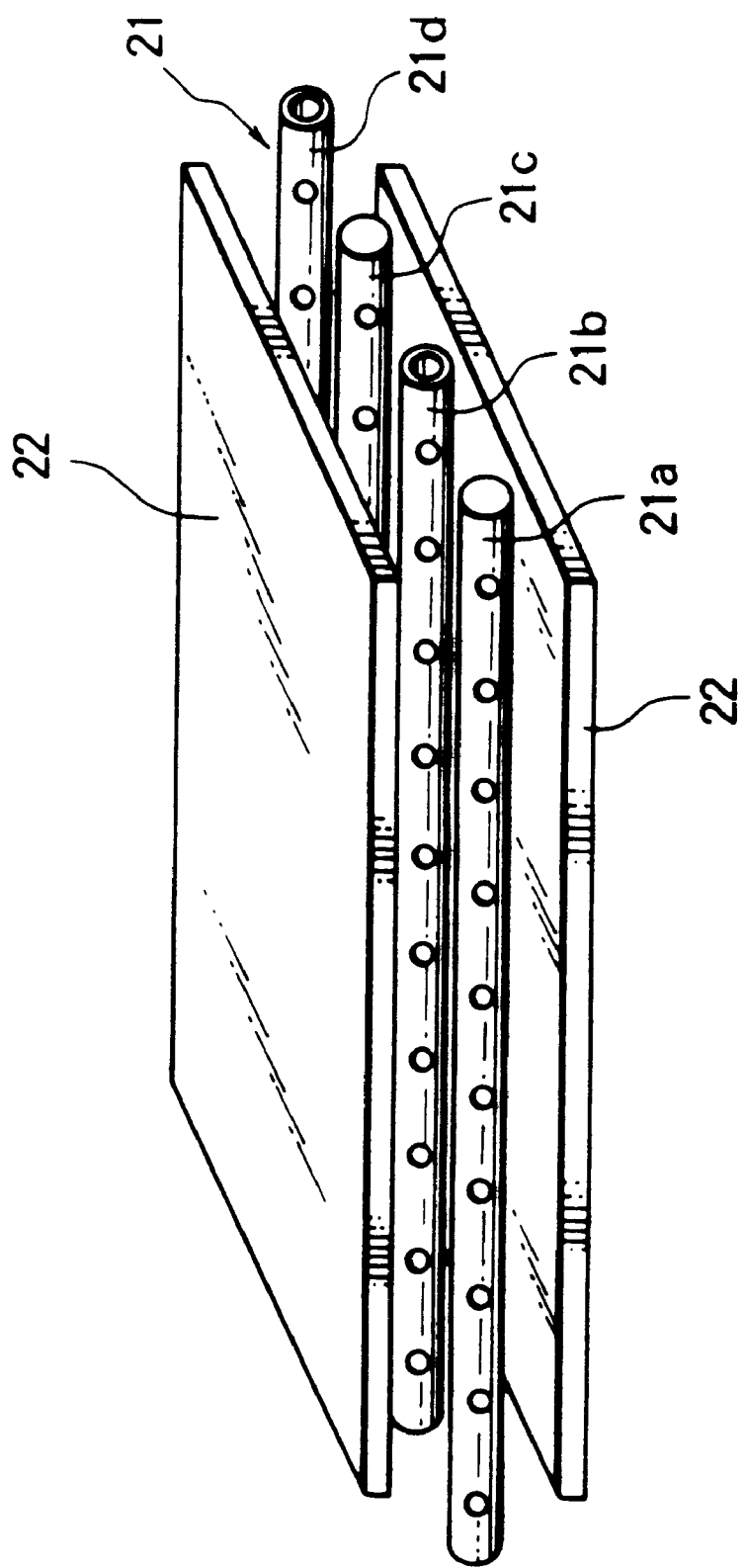
FIG. 2 is a perspective view showing another example of the arrangement relationship between the straight tubular electrode and the substrate.

FIG. 2 shows another example concerning an arrangement positional relationship between the electrode section 21 and the substrates 22. This arrangement example shows the structure of disposing the substrate 22 on both sides of the electrode section 21 and depositing the thin film onto the two substrates at the same time. Since this structure concerning the electrode section 21 is as same as that explained according to FIGS. 1 and 3, the detailed explanation is omitted. On both upper and lower sides of the electrode section 21 the two regions satisfying the same condition can be created and therefore it is possible to dispose the substrate 22 on each of the upper and lower sides in order to form the thin film onto the two substrates simultaneously. FIG. 4 shows the state of plasma generated by the action of the electrode section 21 in accordance with the arrangement example shown in FIG. 2.

In FIG. 4, the two substrates 22 are respectively disposed on the upper and lower sides of the electrode section 21. Each substrate 22 is supported by a holding frame 33 arranged on the periphery thereof. In the tubular electrodes 21a and 21c for supplying the material gas, the plural gas discharge openings 25 discharge it in parallel with the substrate surface as shown by the arrows. This material gas is $SiH_4$, for example. On the other hand, all of the tubular electrodes 21a–21d and another additional tubular electrode 21e, which forms the electrode section 21, are supplied with the high-frequency electric power, and thereby the electric discharge can be excited in the surrounding space of each tubular electrode, so that plasma 34 is generated around the respective tubular electrodes.

Figure 5:
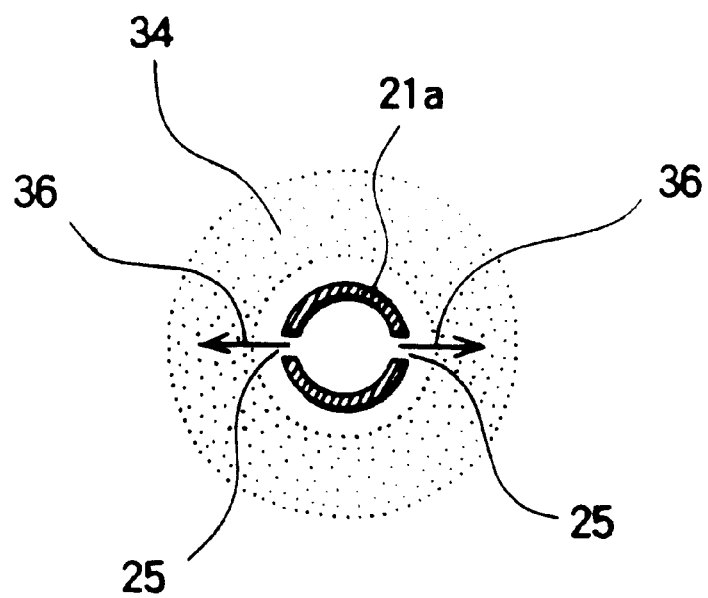
FIG. 5 is a cross section showing the supply state of the material gas and the plasma generated around a tubular electrode by enlarging one part of the tubular electrode for supplying the material gas in FIG. 4.

FIG. 5 is an enlarged figure showing a section designated by a circle 35 in FIG. 4. The tubular electrode 21a for the gas supply has the gas discharge openings 25 of small diameter on both sides thereof as clarified by its cross sectional shape. From this gas discharge opening 25 the material gas is blown off in a lateral direction as shown by an arrow 36. Also, as a result of the electric discharge due to the high-frequency electric power the plasma 34 is generated in the space around the tubular electrode 21a. In a practical manner the plasma 34 is generated around each of the tubular electrodes and is maintained on the basis of the electromagnetic field generated around every tubular electrode.

The region where the plasma 34 is generated becomes a reactive region and consequently the substrate surface being opposite to the plasma 34 can be deposited with the amorphous silicon thin film based on the action of the chemical vapor deposition (CVD). The higher silane can be generated in the region of the plasma 34. Therefore, the tubular electrodes 21b, 21d and 21e suck the gases around them through their plural gas suction openings 26 as shown by arrows and evacuate it to the outside. Each of the gas suction openings 26 is disposed close to the corresponding gas discharge opening 25, and therefore causes the higher silane, which is generated by means of the material gas blown off to the reactive region from the corresponding gas discharge opening 25, to be immediately evacuated to the outside in order to remove it from the reactive gas at once.

As mentioned above, in accordance with the electrode section 21 of the present embodiment, when depositing the amorphous silicon thin film onto the large-area substrate by using the material gas of $SiH_4$ and the like in the plasma CVD apparatus, the higher silane gas and the like generated in the plasma region (reactive region) in front of the substrate surface to be deposited can be removed immediately, and therefore the quality of the amorphous silicon thin film can be highly improved. The structure of the electrode section 21 can make the quality of the thin film deposited onto the substrate surface uniform, since there are no upper and lower stream regions on the substrate surface and therefore any place on the surface can have the almost same condition for the film deposition. Further, in accordance with the structure of the electrode section 21, even if the surface area of the substrate is increased to become wider, it is easy to cope with the area increase of the substrate in terms of the structural modification, since the modification required for the electrode section 21 is only to increase a number of the tubular electrodes for the gas supply and the gas evacuation. The structure of depositing the thin film onto the substrate placed on both sides of the electrode sections 21 has naturally an advantage of causing the productivity on the film deposition to become twice.

Figure 6:
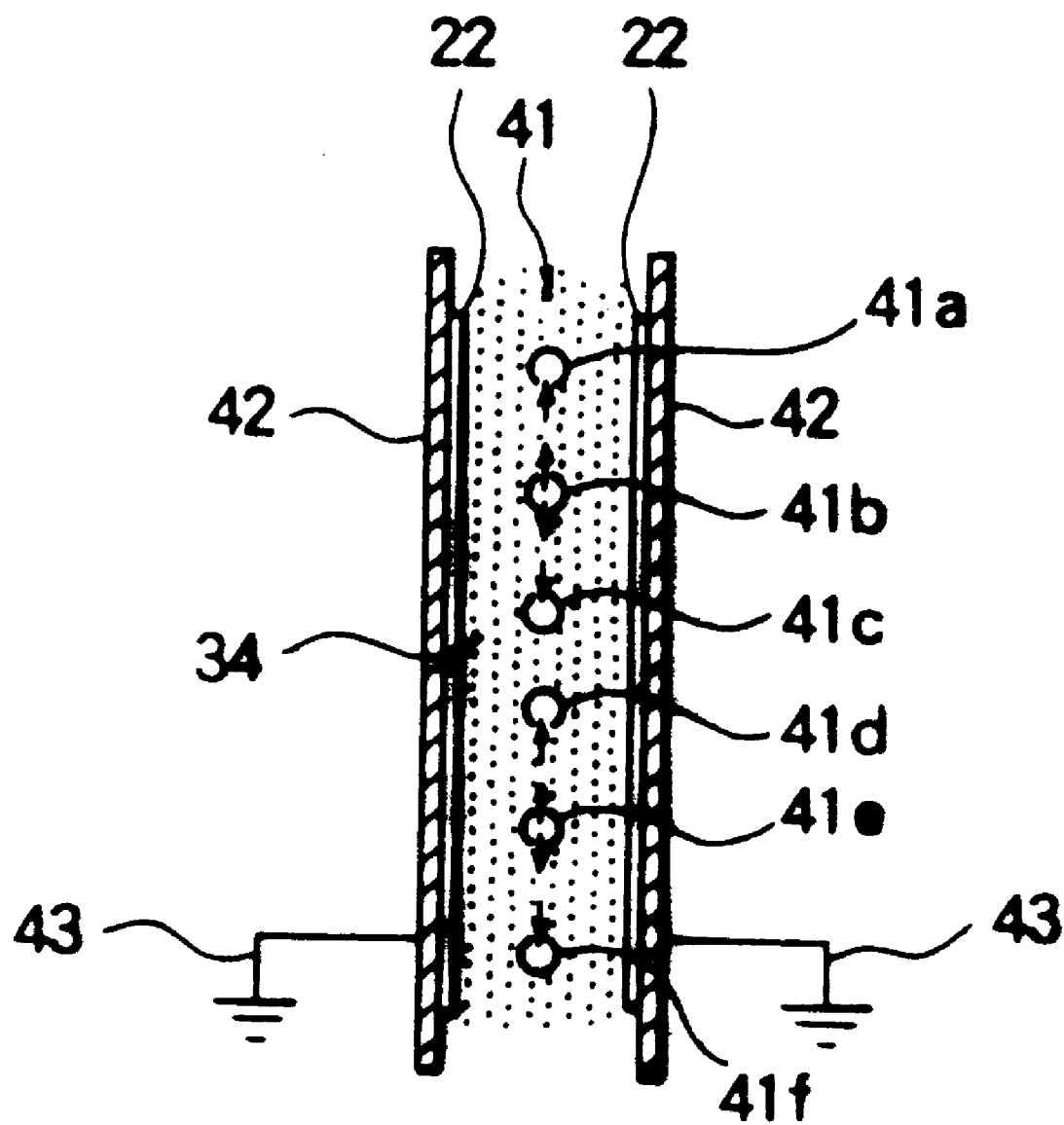
FIG. 6 is a view showing an arrangement example (vertical arrangement type) of arranging the substrate and the tubular electrodes in a vertical direction.

FIG. 6 shows another example of the arrangement concerning the electrode section and the substrates. In this example, the substrates 22 are disposed on the both side of the electrode section 41 and further all of the electrode section 41 and the substrates 22 are arranged in a vertical direction. Each substrate 22 is held by a substrate holder 42. This substrate holder 42 is connected to an earth terminal 43 so as to be grounded. The electrode section 41, in this case, is comprised of six straight tubular electrodes 41a–41f, for example. These tubular electrodes are disposed on a vertical imaginary plane, and all of them are horizontal and parallel with each other. As to these tubular electrodes 41a–41f, 41b and 41e designate the tubular electrodes used for the gas supply while 41a, 41c, 41d and 41f designate the tubular electrodes used for the gas evacuation. The plural gas discharge openings are formed on the upper and lower sides in the tubular electrodes 41b and 41e for the gas supply. Further, as to the tubular electrodes for the gas evacuation, in the tubular electrodes 41a and 41c the plural gas suction openings are formed on the side facing the tubular electrode 41b, and in the tubular electrodes 41d and 41f the plural gas suction openings are formed on the side facing the tubular electrode 41e. The rest of the structure is as same as that explained in the above-mentioned embodiment. The electrode section 41 having such the structure contributes to generate the plasma 34 around each of the tubular electrodes and to deposit the amorphous silicon thin film onto the substrates 22 arranged on the both sides.

The plasma CVD apparatus having the structure shown in FIG. 6 also yields technical effects equivalent to the above-mentioned effects. Further, since the electrode section and the substrate are arranged toward the vertical direction, the adhesion of dust particles onto the substrates can be reduced.

Figure 7:
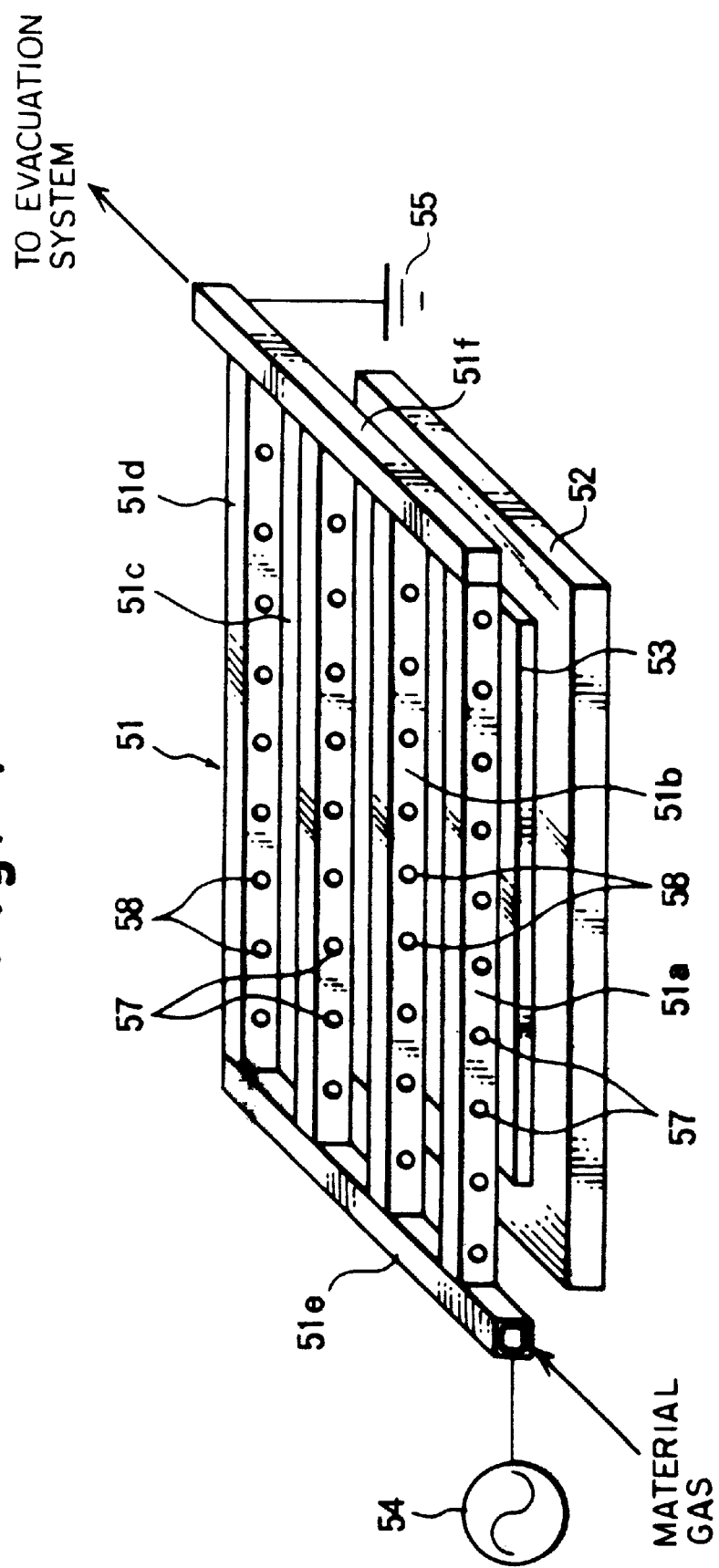
FIG. 7 is a perspective view showing the example of forming the electrode section comprised of tubular electrodes carrying out material gas supply and gas evacuation as a ladder shape.

FIG. 7 shows a modified example of the aforementioned first embodiment. In this modified example, the electrode section shown in FIG. 1 is modified to have a ladder form, for example. In FIG. 7, an electrode section 51 includes four parallel tubular electrodes 51a–51d, and these tubular electrodes 51a–51d are assembled into the ladder form by means of an entrance-side tubular electrode 51e and an exit-side tubular electrode 51f. A tubular body forming each of the tubular electrodes 51a–51f is four-sided tube, for example. A substrate 53 held by means of a substrate holder 52 disposed below the electrode section 51. The substrate 53 may be disposed above the electrode section 51. In this electrode section 51, the base end of the entrance-side tubular electrode 51e is connected to a high-frequency electric source 54 and the tip end of the exit-side tubular electrode 51f is connected to an earth terminal 55.

Figure 3:
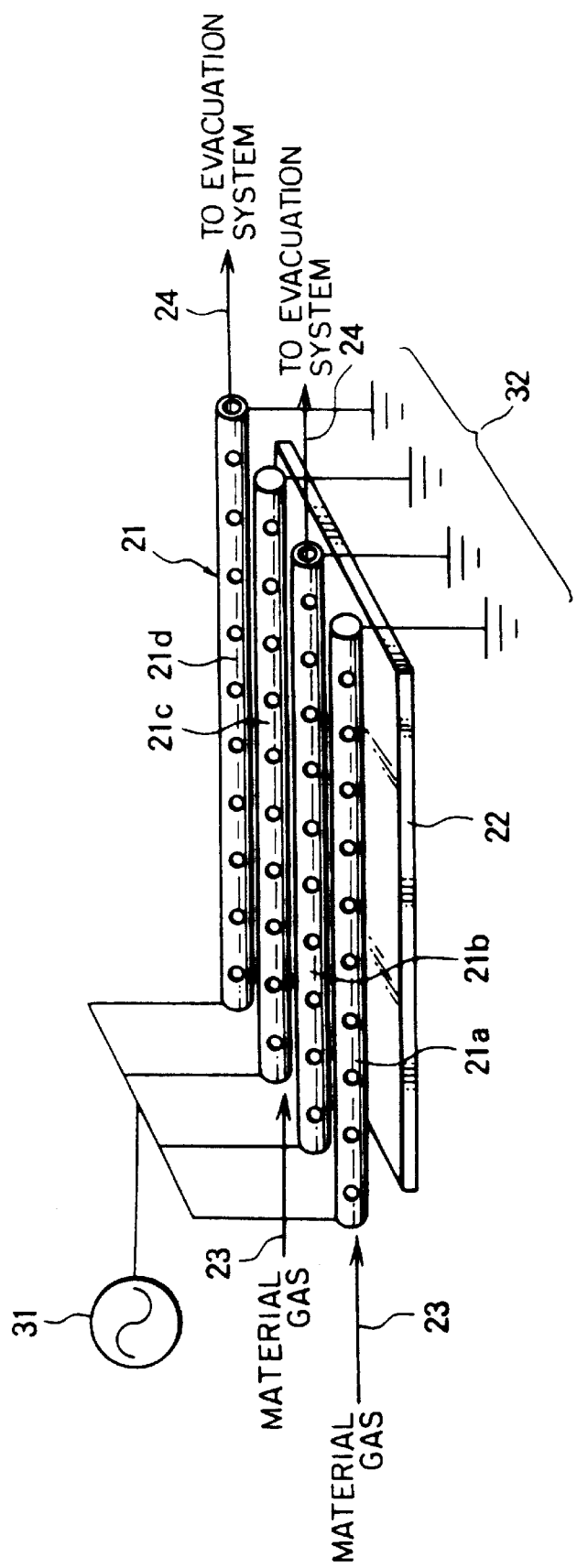
FIG. 3 is a view used for illustrating action of each tubular electrode when carrying out the plasma CVD deposition to the substrate based on the structure shown in FIG. 1.
Figure 8:
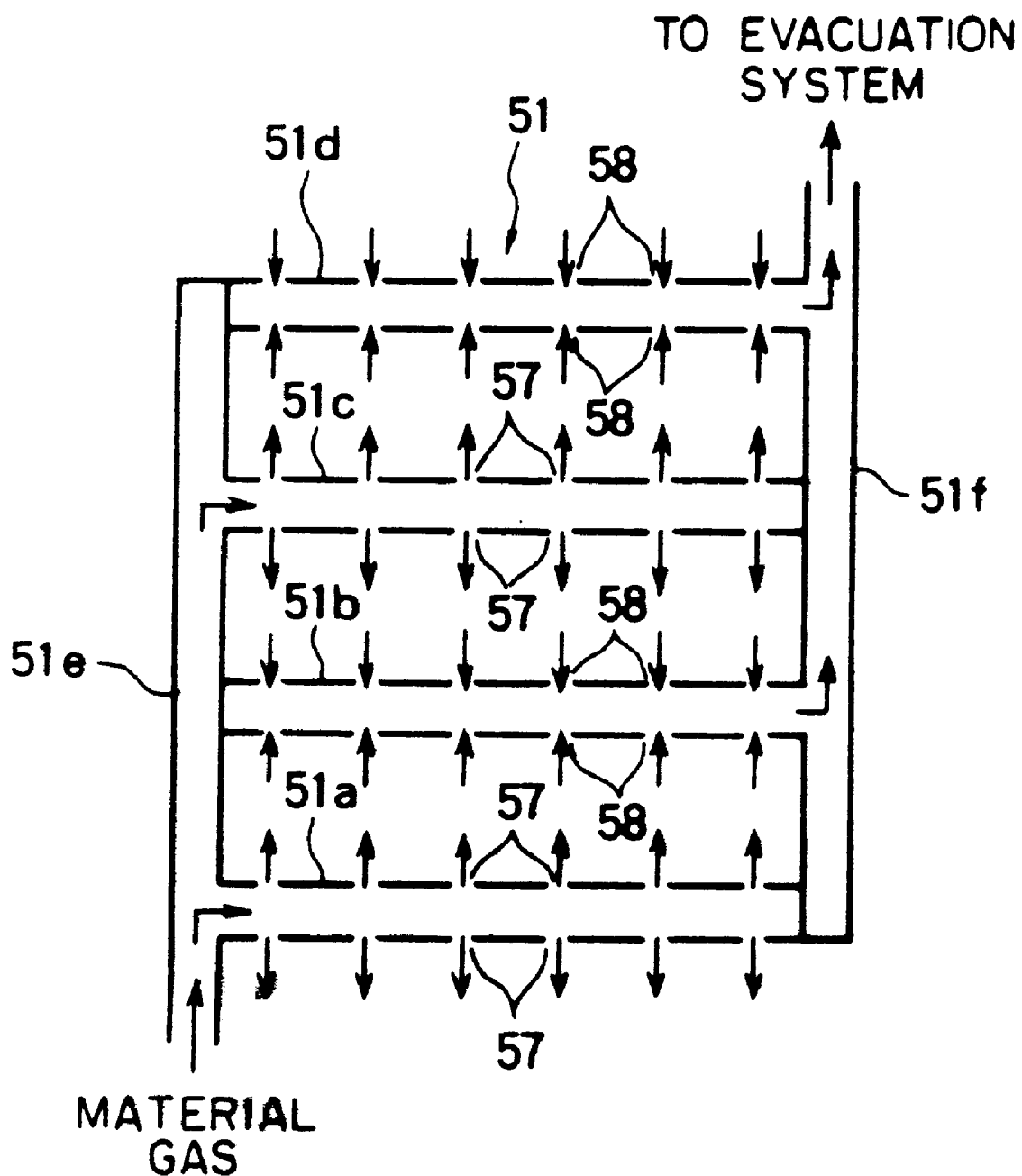
FIG. 8 is a view for illustrating each state of the material gas supply and the gas evacuation based on the electrode section having the ladder shape.

When comparing the electrode section 51 with the aforementioned electrode section 21 explained according to FIGS. 1 and 3, the tubular electrodes 51a, 51b, 51c and 51d correspond to the tubular electrodes 21a, 21b, 21c and 21d, respectively. The structure of the tubular electrodes 51a–51d, the mutual relationship among them, their positional relationship with the substrate, and their function are the same as those concerning the above-mentioned tubular electrodes 21a–21d, and therefore detailed explanation is omitted here. A characteristic structure of this embodiment is shown in FIG. 8. When the material gas is supplied through the entrance-side tubular electrode 51e, it is distributed into the tubular electrodes 51a and 51c for the gas supply and is blown off through a plurality of gas discharge openings 57 formed on both sides thereof. Next, when the higher silane may be generated out of the material gas blown off from the plural gas discharge openings 57 on the basis of chemical reaction, the higher silane is immediately sucked through a plurality of gas suction openings 58 formed on both sides of the tubular electrode 51b and 51d for the gas evacuation and evacuated to the outside through the exit-side tubular electrode 51f.

Figure 9:
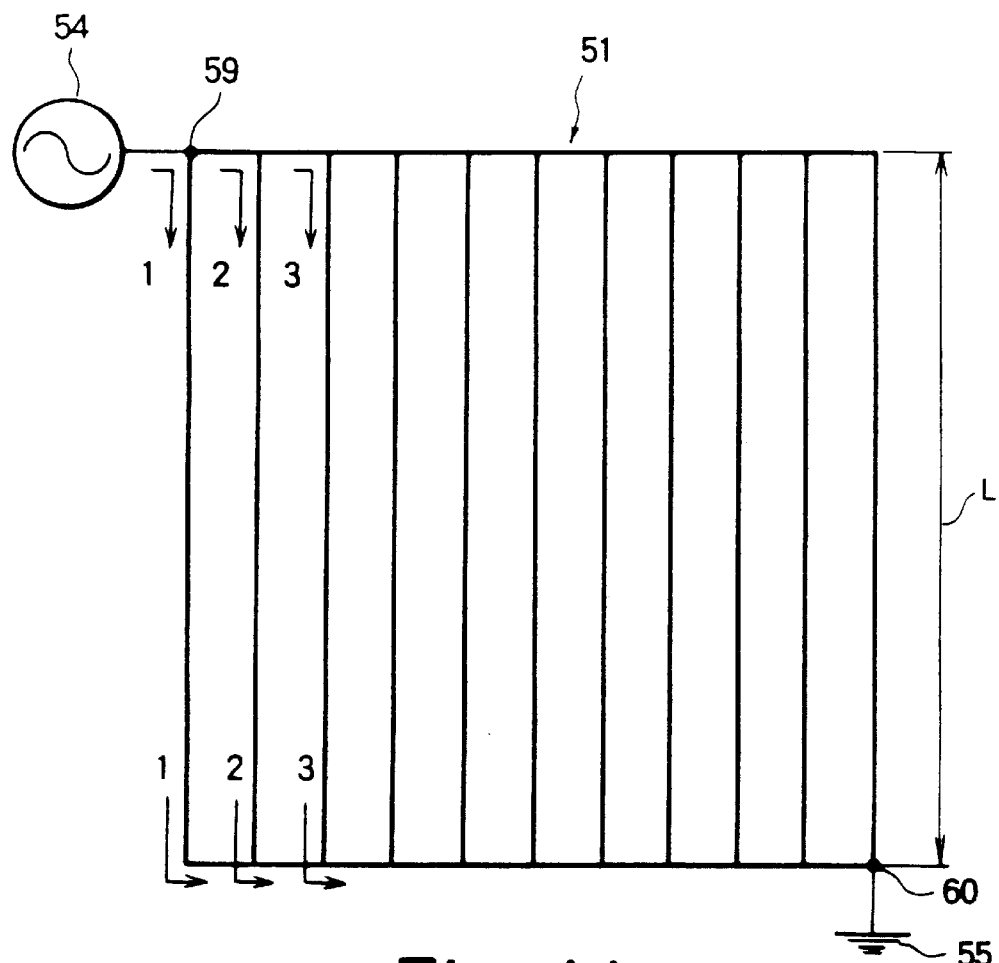
FIG. 9 is a view showing conceptually an actual structural example of the electrode section having the ladder shape.

FIG. 9 is a conceptual figure showing the electrode section 51 formed as a ladder type. The plurality of tubular electrodes are expressed by several parallel lines and in this example the number of lines is increased. The length (L) of the tubular electrode is actually about 1.2 m, for example. The high-frequency power source 54 is connected to a point 59 and an earth terminal 55 is connected to a point 60. Each tubular electrode works as a current path (shown by reference numbers 1, 2, 3, in the figure) through which a high-frequency current supplied from the high-frequency power source 54 flows in a divided mode. The length of each tubular electrode, that is, a current path length is preferably determined to be a natural number times as long as a half of the excitation wave length on the basis of a relationship with a frequency of the supplied excitation high-frequency electric power.

In accordance with the electrode section 51 shown in the aforementioned example, in addition to each advantage mentioned above, it has other advantages such that its whole structure can be made as one, its structure can be simplified because of one supply point for the high-frequency electric power supply, and it can be easily manufactured at a low cost.

Figure 10:
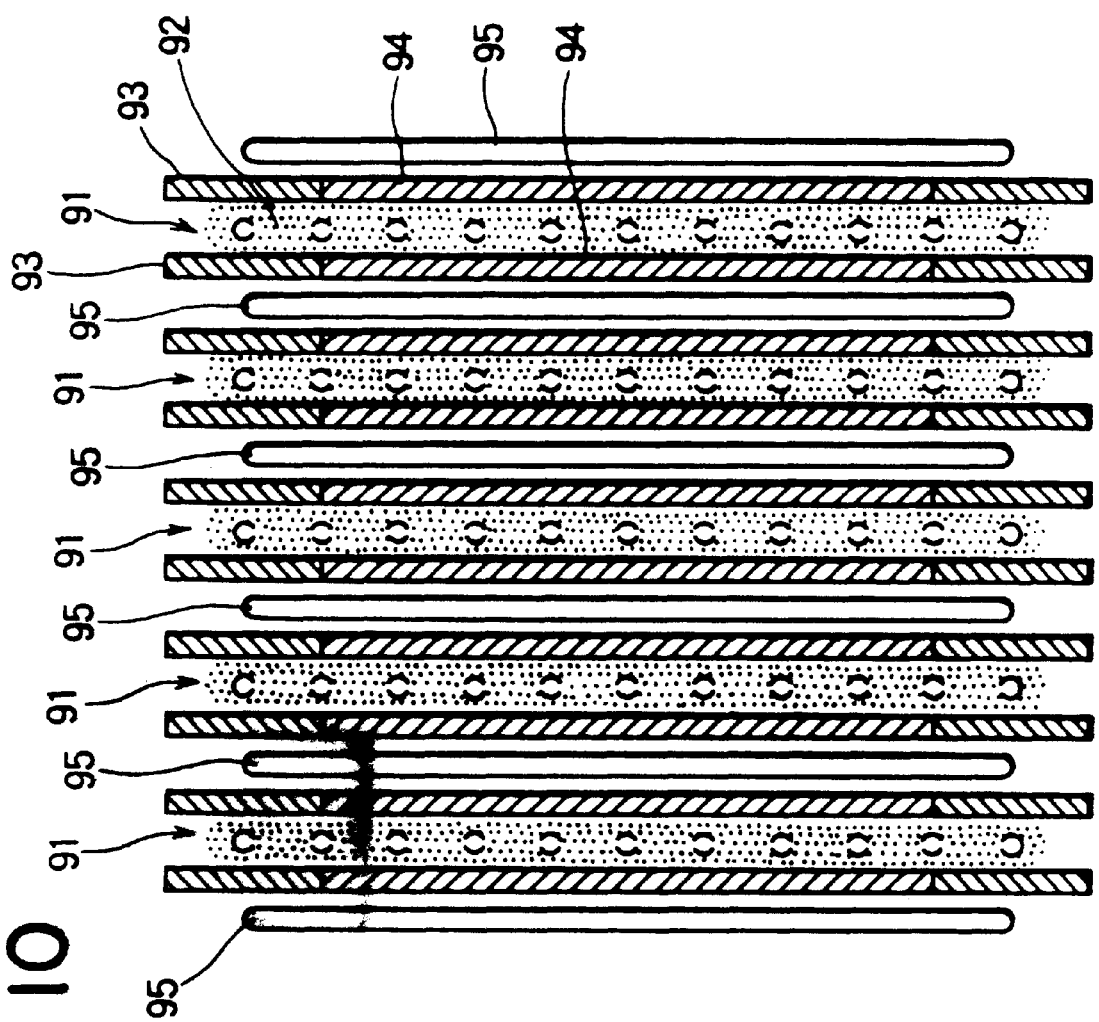
FIG. 10 is a cross section showing an example of a multi-layers structure of a vertical arrangement type based on the first embodiment of the present invention.

FIG. 10 shows another modified example of the first embodiment of the present invention. In this modified example, several electrode sections 91 are arranged to form a multiple-layers structure, that is, a five-layers structure concretely, for example. Each electrode section 91, for example, as being similar to the example shown in FIG. 6, is disposed to be of a longitudinal arrangement state (in a vertical direction). Each electrode section 91 has almost the same structure as the electrode section 21 shown in FIG. 3, for example. However, in the electrode section 91, the number of the straight tubular electrodes is increased. In each electrode section 91, plasma 92 is generated around the tubular electrode by supplying the material gas and the high-frequency electric power. On both sides of each electrode section 91 a substrate (a glass substrate) 94 held by a holding frame 93 is disposed toward a vertical direction. A surface of the substrate 94 being on the side of the electrode section 91 is the surface on which the thin film may be deposited. A heater 95 may be arranged on the back side of the substrate 94. According to this example, the structure comprised of the electrode section 91 and the two substrates 94 disposed on both sides thereof makes one unit and further a five-layers system is formed by using the five units. The structure according to this modified example of the first embodiment can increase the productivity of the film deposition process.

Figure 11:
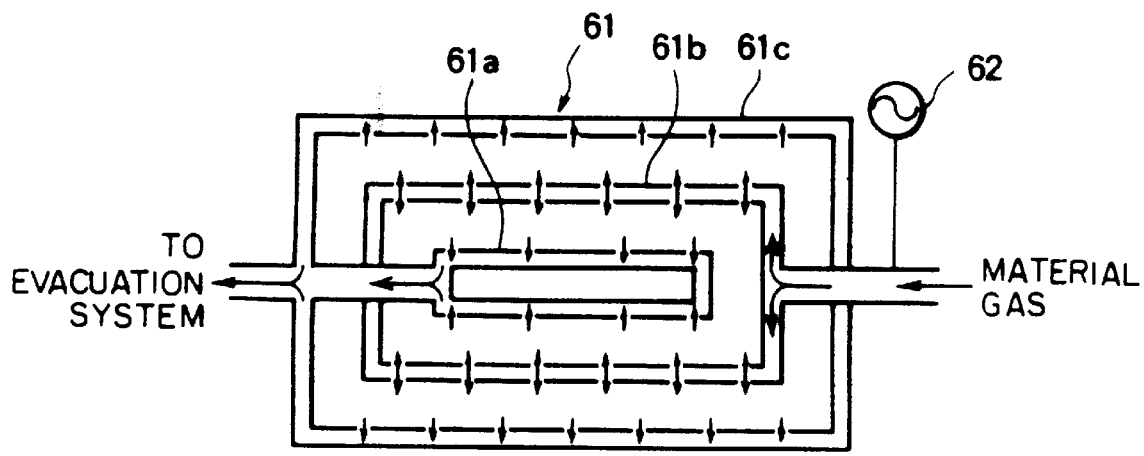
FIG. 11 is a plane view showing the second embodiment of the electrode section of in the plasma CVD apparatus of the present invention and further an example of tubular electrodes having a four-sided ring shape as a whole.

FIG. 11 shows the second embodiment of the electrode section of the present invention. In this embodiment, an electrode section 61 used in the plasma CVD apparatus is comprised of some tubular electrodes 61a, 61b and 61c with a quadrilateral ring-shaped form, for example. A cross section of each tubular electrode may be a circle or a quadrilateral. The tubular electrodes 61a–61c are disposed on an imaginary plane parallel to a substrate not shown in the figure, and further, as shown in FIG. 11, they have different sizes individually and are arranged in accordance with a concentric positional relationship so that a smaller one may be at the inside and a larger one may be at the outside. The tubular electrodes 61a–61c are disposed at almost regular intervals. The tubular electrodes 61b of a middle position is for supplying the material gas, and the tubular electrodes 61a and 61c disposed respectively at the inside and the outside of the tubular electrode 61b are both for evacuating the unnecessary gases. The material gas is introduced into the tubular electrode 61b and further the exit sections of the tubular electrodes 61a and 61c are connected to an evacuation system. A plurality of gas discharge openings are formed on both sides of the tubular electrode 61b at regular intervals, for example, and the material gas is blown off through the gas discharge openings as shown by arrows. On the other hand, a plurality of gas suction openings are formed on the side of the tubular electrodes 61a and 61c facing the tubular electrode 61b, and the gases such a byproduct are sucked through the gas suction openings as shown by arrows. Further, the base end of the tubular electrode 61b is connected to a high-frequency power source 62. The electrode section 61 having the above-mentioned structure can attain the same technical advantageous effects as those mentioned above.

FIG. 12 shows the third embodiment of the present invention. The reactor 11 of the plasma CVD apparatus of the present invention is comprised of a lower container 11a and an upper container 11b. An insulation ring member 71 is arranged between the lower and upper containers 11a and 11b. A substrate holder 73 having a heater 72 built-in is arranged in the lower container 11a. The substrate holder 73 is grounded. A substrate 74 is loaded on the substrate holder 73. An electrode section 75 according to the present invention is incorporated into the upper container 11b.

The electrode section 75 is provided with a plate member 76 facing the substrate 74, in which a plurality of gas discharge openings 76a blowing the material gas off and a plurality of gas suction openings 76b sucking the gases such as byproducts are formed. In the plate member 76, each gas discharge opening 76a and each gas suction opening 76b are formed to be near with each other in respect of their positional relationship, so that the material gas can be supplied into the plasma generated in the front space of the substrate 74 and the higher silane and the like generated by the chemical reaction can be evacuated immediately. The material gas supplied from a top plate of the upper container 11b is introduced into an introduction space 78 through an introduction section 77. The material gas goes through a diffusion plate 79 disposed within the introduction space 78 and further goes through a plurality of pipe-shaped passages 80, and finally is supplied into the front space of the substrate 74 through the above-mentioned gas discharge openings 76a in a dispersion mode. The electrode section 75 has an electrode rod 82 at a center position thereof with an insulator 81 covering it, to which the high-frequency electric power is supplied. In the front space of the substrate 74, the electric discharge is excited by means of the high-frequency electric power so as to generate the plasma. The electrode section 75 has a space 83 used for the gas evacuation. The higher silane generated in the reactive region in front of the substrate 74 is immediately sucked through the gas suction openings 76b and further evacuated to the outside through the evacuation space 83. The electrode section 75 of this embodiment is not provided with the tubular electrode for the gas supply and the tubular electrode for the gas evacuation, which have been explained in the aforementioned embodiments. However, since the electrode section 75 is provided with a gas supply body with the plural gas discharge openings 76a and a gas evacuation body with the plural gas suction openings 76b, it has the substantial same structure as that explained in the above-mentioned embodiments. Accordingly, the structure of the present embodiment also can cause the aforementioned technical effects to be yielded.

Next, a way of the high-frequency electric power supply in each embodiment mentioned above will be explained below. It is preferable to supply the high-frequency electric power intermittently. When depositing the amorphous silicon thin film onto the large-area substrate made out of an insulator through the plasma CVD method, it is preferable to supply the high-frequency electric power for exciting the electric discharge intermittently so as to form the thin film with uniform film quality and film thickness. While the high-frequency electric power is applied, in addition to $SiH_3$ proving to be a precursor for a quality film, $SiH_2$ and the like is generated in the electric discharge space. This $SiH_2$ and the like successively collides with the $SiH_4$ being a parent molecule to produce a polymerization reaction and cause powder to be generated. The generated powder becomes negatively charged and is caught electrostatically within the plasma. While the powder is being caught, the polymerization reaction is advanced and as a result the powder is deposited on the surface of the thin film deposited on the substrate. The aforementioned intermittent electric discharge enables to evacuate and remove the powder generated by the polymerization reaction, that is, a polymer, during the stop time period of the electric discharge while the electrostatic capture of the powder is not carried out. If in the plasma CVD apparatus gas outlets of a evacuation mechanism are arranged in only peripheral regions of a substrate and further the area of the substrate is increased, the removal efficiency of the polymer based on the evacuation mechanism becomes low and the term for stopping the electric discharge is required to become long in vain, since a path for gas evacuation becomes long inevitably. Therefore, the evacuation structure having the gas outlets arranged in the peripheral region causes an effective film deposition rate to be lowered. As explained in each embodiment of the present invention, the evacuation structure, in which the gas evacuation is carried out through the high-frequency (RF) electrodes directly, makes it possible to increase the area of the substrate with maintaining the original feature of the intermittent electric discharge method.

Although the above-mentioned embodiments were mainly explained from the point of view of structure and action as the plasma CVD apparatus, the action can be naturally grasped as the plasma CVD method used for manufacturing solar cells. Further, in the solar cells manufactured by using the plasma CVD apparatus of the present invention or by applying the plasma CVD method of the present invention, the amorphous silicon thin film has the feature such that the effect of byproducts such as the higher silane generated in the plasma during the film deposition process can be reduced and therefore it can have a film quality. Accordingly, the solar cells with quality and efficiency can be made.

The plasma CVD apparatus of the present invention can form the amorphous silicon thin film with film quality on the large-area substrate, since it has the electrode section capable of immediately evacuating the gases such as the higher silane generated in the reactive region of the plasma CVD apparatus. If this plasma CVD apparatus is used as the apparatus for manufacturing the solar cells, the film quality of the amorphous silicon thin film formed on the solar cells can be improved and therefore the solar cells with efficiency can be made.

Also, the plasma CVD method of the present invention, which is applied to manufacture the solar cells, can shorten the residual time of the byproducts such as the higher silane gas in the reactor, prevent the effect of the byproducts to the thin film, and improve the film quality of the solar cells.

Further the solar cells made by the plasma CVD apparatus or the method thereof of the present invention can have better film quality because the adhesion amount of the byproducts on the amorphous silicon thin film can be reduced.

What is claimed is:

1. A plasma CVD apparatus in which a substrate is disposed in a reactor kept to be at a predetermined vacuum state by an evacuation mechanism, and a thin film is deposited on a surface of the substrate by chemical vapour deposition enhanced by plasma produced by supplying a material gas into a front space of the surface and supplying high-frequency electric power to the material gas to generate electric discharge excitation in the front space, comprising:

a gas supply body having a plurality of gas discharge openings through each of which the material gas is supplied into the front space, and a gas evacuation body having a plurality of gas suction openings through each of which the gas around the gas suction openings is evacuated to the outside, wherein the plural gas discharge openings and gas suction openings are arranged so that an individual gas discharge opening and gas suction opening are approached mutually, and said gas supply body and said gas evacuation body are supplied with the high-frequency electric power and used as an electrode.

2. The plasma CVD apparatus according to claim 1, wherein said gas supply body has a plurality of straight tubes disposed within an imaginary plane substantially parallel to said substrate and said gas evacuation body has also a plurality of straight tubes disposed within said imaginary plane, and said plural straight tubes for gas supply and said plural straight tubes for gas evacuation are alternately disposed in a parallel mode and said gas discharge opening faces to said gas evacuation opening individually.

3. The plasma CVD apparatus according to claim 2, wherein said plural straight tubes for gas supply and said plural straight tubes for gas evacuation are configured to form a ladder shape.

4. The plasma CVD apparatus according to claim 3, wherein the number of said substrate is two and these substrates are arranged to be parallel, and said imaginary plane within which said plural straight tubes used for gas supply and said plural straight tubes used for gas evacuation are disposed is set to lie in a middle position between said two substrates.

5. The plasma CVD apparatus according to claim 2 wherein the number of said substrate is two and these substrates are arranged to be parallel, and said imaginary plane within which said plural straight tubes used for gas supply and said plural straight tubes used for gas evacuation are disposed is set to lie in a middle position between said two substrates.

6. The plasma CVD apparatus according to claim 5, wherein a structure comprising of a section formed by said straight tubes for gas supply and said straight tubes for gas evacuation, and the substrates disposed on both sides of said section, is defined as one unit, and a layered structure is formed by arranging said unit to make several unit layers, and a heater is arranged on a rear side of each of the substrates.

7. The plasma CVD apparatus according to claim 2, wherein each of said plural straight tubes for gas supply and each of said plural straight tubes for gas evacuation has a high-frequency current path length being a natural number times as long as a half of an excitation wave length of the high-frequency electric power for exciting an electric discharge.

8. The plasma CVD apparatus according to claim 2, wherein said substrate and said imaginary plane are disposed to be vertical.

9. The plasma CVD apparatus according to claim 1, wherein said gas supply body is formed by a plurality of ring-shaped tubes disposed within an imaginary plane substantially parallel to said substrate to have a concentric positional relationship, and said gas evacuation body is formed by a plurality of ring-shaped tubes disposed within the imaginary plane to have a concentric positional relationship, and said plural ring-shaped tubes for gas supply and said plural ring-shaped tubes for gas evacuation are alternately disposed with maintaining the concentric positional relationship and said gas discharge openings face to said gas suction openings individually.

10. The plasma CVD apparatus according to claim 9, wherein the number of said substrate is two and these substrates are disposed to be parallel, and said imaginary plane within which said plural ring-shaped tubes for gas supply and said plural ring-shaped tubes for gas evacuation are disposed is set to lie in a middle position between said two substrates.

11. The plasma CVD apparatus according to claim 1, wherein said high-frequency electric power for exciting the electric discharge is supplied intermittently.

* * * * *